(12) United States Patent
Yoshida et al.

(10) Patent No.: US 6,426,584 B2
(45) Date of Patent: Jul. 30, 2002

(54) ELASTIC WAVE DEVICE

(75) Inventors: Kenji Yoshida; Shusou Wadaka; Koichiro Misu; Tsutomu Nagatsuka; Kouji Murai, all of Tokyo; Masatsune Yamaguchi, Chiba; Kenya Hashimoto, Chiba; Tatsuya Ohmori, Chiba, all of (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/800,929

(22) Filed: Mar. 8, 2001

Related U.S. Application Data

(63) Continuation of application No. PCT/JP00/04469, filed on Jul. 5, 2000.

(30) Foreign Application Priority Data

Jul. 16, 1999 (JP) ............................................. 11-203662

(51) Int. Cl.$^7$ ............................................... H01L 41/08
(52) U.S. Cl. .............................. 310/313 A; 310/313 B; 310/313 D
(58) Field of Search ......................... 310/313 R, 313 A, 310/313 B, 313 D

(56) References Cited

U.S. PATENT DOCUMENTS 6,025,636 A * 2/2000 Nakahata et al. ..... 310/313 A X
6,246,150 B1 * 6/2001 Mitobe ................... 310/313 B

FOREIGN PATENT DOCUMENTS

| JP | A5315886 | 11/1993 |
|---|---|---|
| JP | A6237140 | 8/1994 |
| JP | A9153756 | 6/1997 |
| JP | A9167936 | 6/1997 |
| WO | A1-9904489 | 1/1999 |

OTHER PUBLICATIONS

Hashimoto et al., Paper of Instit. of Elec. and Commun. Engineers of Japan, vol. J67–C, No. 1, pp. 158–165 (1984).
Shimizu et al., Technical Research Report of Denshi Tsushin Gakkai, vol. 85, No. 299, pp. 65–72 (1986).
Shimizu et al., Technical Research Report of Denshi Tsushin Gakkai, vol. 79, No. 176, pp. 15–22 (1979).
Hashimoto et al., Recent Research of Elastic Wave Devce Technique, "Simulation of SAW Devices by the Discrete Green Function".
Hashimoto et al., Recent Research of Elastica Wave Device Technique, Simple Mathematical Model for Leaky–SAW Resonator Simulation.
Hashimoto, 23$^{rd}$ EM Symposium, "Leaky SAW and SH SAW—Comparison with Rayleigh SAW".
2$^{nd}$ Chapter Excitation and Reception of Surface Acoustic Wave, 2.2 Surface acoustic wave transducer using reed screen shaped electrodes.
3.2 Resonator, 3.2.2 Characteristics of Resonator.
2.3.2 Resonator Type Filter.
Handbook of Elastic Wave Technique.

* cited by examiner

Primary Examiner—Mark O. Budd

(57) ABSTRACT

In an elastic wave device, an electrode, which is formed in a comb-like shape and is made of conductive material having a prescribed thickness, is arranged on a substrate of a piezo-electric element containing lithium niobate as a main component. Also, in this elastic wave device, a surface of the substrate is set to a plane which is obtained by rotating a plane perpendicular to a crystal Y-axis of the lithium niobate by an angle ranging from 55 degrees to 57 degrees around a crystal x-axis of the lithium niobate, and a duty ratio (a width w of an electrode finger/an arrangement interval p of a pair of electrode fingers) of each of a plurality of electrode fingers composing the electrode is equal to or higher than 0.4 and is lower than 1.0.

5 Claims, 9 Drawing Sheets

ELASTIC WAVE DEVICE

CROSS-REFERENCE TO The RELATED APPLICATION

This application is a continuation of International Application No. PCT/JP00/04469, whose International filing date is Jul. 5, 2000, the disclosures of which Application are incorporated by reference herein.

BACKGROUND OF THE INVENTION

1. Field of the Invention

The present invention relates to an elastic wave device, which is used in a circuit of a communication apparatus or an electronic apparatus to propagate an elastic wave.

2. Description of Related Art

FIG. 1 shows an example of characteristics of a conventional elastic wave device in which lithium niobate ($LiNbO_3$, called LN) is conventionally used. This example is indicated in Published Unexamined Japanese Patent Application H9-167936 (1997) (first literature). In FIG. 1, a Y-axis indicates a propagation loss of a surface acoustic wave (called SAW), and a propagation loss per one wavelength ($\lambda$) of the surface acoustic wave denoting a propagated distance is indicated by a unit of decibel (dB). An X-axis indicates a normalized electrode thickness ($h/\lambda$) normalized by using the wavelength $\lambda$. Here, a symbol h indicates an electrode thickness.

The characteristics shown in FIG. 1 are obtained by setting a propagation direction of the surface acoustic wave to a direction along a crystal X-axis of the lithium niobate and by setting a substrate surface to a plane perpendicular to a $\theta$-rotated Y-axis which is obtained by rotating a crystal Y-axis of the lithium niobate by an angle $\theta$ around the crystal x-axis. In particular, the rotation angle $\theta$ of the crystal Y-axis ranges from 62 to 74 degrees.

FIG. 2 is a cross sectional view of the conventional elastic wave device. In FIG. 2, 1 indicates a lithium niobate (LN) substrate. 2 indicates an electrode which is made of aluminum (Al) and is arranged on the LN substrate 1. As shown in FIG. 2, a plane perpendicular to the $\theta$-rotated Y-axis is set to a surface of the LN substrate 1, and the characteristics shown in FIG. 1 are determined in the case where the whole surface of the LN substrate 1 is covered with an electrode material 2 having a thickness h. The electrode 2 is usually made of aluminum (Al). In cases where the plane perpendicular to the $\theta$-rotated Y-axis is set to a surface of the LN substrate 1 and the crystal X-axis of the LN substrate 1 is set to the propagation direction of the surface acoustic wave, the LN substrate 1 is expressed by $\theta$-rotated Y-cut X-propagation lithium niobate and is abbreviated to $\theta$YX-LN or $\theta$YX- $LiNbO3$.

As is apparent in the characteristics shown in FIG. 1, in cases where a cut angle $\theta$ (or a rotation angle $\theta$) is, for example, equal to 62 degrees, the propagation loss is minimized in the neighborhood of the normalized electrode thickness ($h/\lambda$) set to 0.03. Also, in cases where a cut angle $\theta$ is equal to 74 degrees, the propagation loss is minimized in the neighborhood of the normalized electrode thickness ($h/\lambda$) set to 0.1. Therefore, in cases where a surface acoustic wave (SAW) device is manufactured on condition that the normalized electrode thickness ($h/\lambda$) is higher than 0.05, it is realized that a cut angle $\theta$ is higher than 66 degrees to minimize the propagation loss. As is described above, the propagation loss can be minimized by selecting an appropriate combination of the normalized electrode thickness ($h/\lambda$) and the cut angle $\theta$, and an insertion loss of the SAW device can be reduced.

Here, several types waves other-than the surface acoustic wave are also called the elastic waves. In cases where the propagation direction is set to the X-axis of the LN substrate 1 and the cut angle $\theta$ is set to a value ranging from 62 to 74 degrees, a surface skimming bulk wave (SSBW) denoting a type of bulk wave and a leaky surface acoustic wave (LSAW) are propagated though the surface of the LN substrate 1. These SSBW and LSAW are disclosed in a literature: "Paper of Institute of Electronics and Communication Engineers of Japan", 84/1, Vol.J67-C, No.1, pp.158-165 (second literature). However, in this application, the SAW, SSBW and LSAW are generally called the surface acoustic wave SAW except where it is required to distinguish the SAW, SSBW and LSAW from each other.

FIG. 3 is a diagram showing the configuration of a surface acoustic wave (SAW) filter denoting a type of elastic wave device. In FIG. 3, 1 indicates a lithium niobate (LN) substrate functioning as a piezo-electric element. 3 indicates an electrode finger. 4 indicates a bonding pad. 5 indicates an input-side inter-digital transducer (IDT), which is composed of the input-side electrode fingers 3 arranged in a comb-like shape, for performing an energy transformation from electricity to surface acoustic wave. 6 indicates an output-side inter-digital transducer (IDT), which is composed of the output-side electrode fingers 3 arranged in a comb-like shape, for performing an energy transformation from surface acoustic wave to electricity. 7 indicates an input terminal. 8 indicates an output terminal. A length of portions of the electrode fingers 3 crossing each other is called an aperture width W, and a maximum value of the aperture width W is called a maximum aperture width W0.

FIG. 4 is a cross sectional view of the SAW filter shown in FIG. 3. In FIG. 4, a symbol "w" indicates an electrode finger width of each electrode finger 3. A symbol "p" indicates an arrangement interval of each pair of electrode fingers 3. A symbol "h" indicates an electrode thickness of each electrode finger 3.

Next, an operation is described.

When an electric signal is supplied to the input terminal 7, an electric field is generated in a crossing area of each pair of electrode fingers 3 of the input-side IDT 5. In this case, because the LN substrate 1 functions as a piezo-electric element, distortion is caused in the LN substrate 1 by the electric field. In cases where the electric signal has a frequency f, the distortion caused in the LN substrate 1 is changed with time to oscillate the LN substrate 1 at the frequency f. Therefore, a surface acoustic wave (SAW) is generated in the LN substrate 1 and is propagated through the LN substrate 1 in a direction perpendicular to a longitudinal direction of the electrode fingers 3. Thereafter, the propagated surface acoustic wave is transformed into an electric signal in the output-side IDT 6. Here, a process, in which an electric signal is transformed into a surface acoustic wave, and a process, in which a surface acoustic wave is transformed into an electric signal, have a reversible relationship with each other.

As shown in FIG. 1, in cases where the cut angle $\theta$ is near to 64 degrees and the propagation direction is set to a direction along the X-axis, as is disclosed in the second literature, a displacement component of the surface acoustic wave is parallel to the electrode fingers 3, and the surface acoustic wave has a directional component parallel to the surface of the LN substrate 1. The displacement component of the surface acoustic wave depends on a material of the LN substrate 1, a cut surface of the LN substrate 1, a cut angle θ of the cut surface and a propagation direction of the surface acoustic wave. The surface acoustic wave oscillated in the input-side. IDT 5 is propagated toward the output-side IDT 6. In cases where the LN substrate 1 causes a propagation loss to the surface acoustic wave, an electric power of the surface acoustic wave arriving at the output-side IDT 6 becomes lower than that of the surface acoustic wave obtained just after the oscillation of the LN substrate 1 in the input-side IDT 5. A degree of the propagation loss caused to the surface acoustic wave is almost equal to a value which is obtained by multiplying a standardized distance by a propagation loss per one wavelength shown in FIG. 1. The standardized distance is obtained by standardizing a distance between the center of the input-side IDT 5 and the center of the output-side IDT 6 with respect to the wavelength of the surface acoustic wave.

Therefore, in cases where the distance between the input-side IDT 5 and the output-side IDT 6 is fixed to a constant value, as the propagation loss per wavelength in the LN substrate 1 is increased, an insertion loss of the SAW filter is increased. As is described in a literature: "Surface Acoustic Wave Technology" edited by Institute of Electronics and Communication Engineers of Japan and published by Korona publishing company, November of 1983, pp.56-81 (third literature), the wavelength λ of the surface acoustic wave is equivalent to double of the arrangement interval p of the electrode fingers 3. Therefore, even though the input-side IDT 5 and the output-side IDT 6 are arranged to be near to each other, a propagation loss, which is roughly obtained by multiplying a propagation loss per wavelength by a value equal to half of the average number of electrode fingers 3 arranged in both the input-side IDT 5 and the output-side IDT 6, is necessarily caused in the LN substrate 1.

For example, as shown in FIG. 3, in cases where each of the input-side IDT 5 and the output-side IDT 6 arranged to be near to each other is composed of seven electrode fingers 3, a propagation loss caused in the LN substrate 1 is roughly equal to three or four times of the propagation loss per wavelength shown in FIG. 1. For example, in cases where the propagation loss per wavelength is equal to 0.02 (dB/λ), a propagation loss caused to the LN substrate 1 ranges from 0.06 to 0.08 dB.

That is, to obtain an SAW device having a low propagation loss, it is important to use an LN substrate 1 in which a low propagation loss per wavelength is caused. Therefore, lithium niobate (LN) processed at the cut angle θ higher than 64 degrees is used for a conventional elastic wave device.

As is described above, the propagation loss per wavelength considerably influences on the insertion loss of the SAW filter. However, the influence on the insertion loss of the SAW filter is not limited to the propagation loss per wavelength in the LN substrate 1. That is, as material constants indicating characteristics of the LN substrate 1, an electro-mechanical coupling coefficient $K^2$ relating to a transformation efficiency between electric signal and elastic wave, an electrostatic capacitance C0 relating to impedances of the input-side IDT 5 and the output-side IDT 6 and a propagation speed V of elastic wave are known as well as the propagation loss per wavelength. In these material constants, the electro-mechanical coupling coefficient $K^2$ is important to determine the insertion loss of the SAW filter and a pass band width.

Also, the propagation of the surface acoustic wave in the case where the whole surface of the LN substrate 1 is covered with the electrode 2 as shown in FIG. 2 differs from that in the case where the electrode fingers 3 are periodically arranged on the LN substrate 1 as shown in FIG. 4. In practical use, the SAW filter has a structure in which the electrode fingers 3 are periodically arranged as shown in FIG. 4. Therefore, characteristics indicated by the practically-used SAW filter differ from those indicated by an SAW filter in which the whole surface of the LN substrate 1 is covered with the electrode 2 as shown in FIG. 2. Therefore, though the requirement for the material constants to obtain an elastic wave device indicating the most preferable characteristics are known in an elastic wave device using a pure surface acoustic wave such as Rayleigh wave or Bleustein-Gulyaev-Shimizu (BGS) wave for which no propagation loss is caused in principle, the requirement is not known in an elastic wave device using surface skimming bulk wave (SSBW) or leaky surface acoustic wave (LSAW).

Because the conventional elastic wave device has the above-described configuration, a conventional elastic wave device, in which the whole surface of the LN substrate 1 is covered with the electrode 2, is manufactured so as to minimize the propagation loss. However, a required condition for the material constants to make an elastic wave device using the SSBW or LSAW indicate the most preferable characteristics differs from a condition for minimizing the propagation loss. Therefore, there is a problem that the characteristics indicated by the conventional elastic wave device deteriorate because of the difference in the condition. That is, there is a problem that the insertion loss in the conventional elastic wave device deteriorates as compared with a minimum insertion loss required for practical use.

Also, though the conventional elastic wave device is manufactured so as to minimize the propagation loss, because the electro-mechanical coupling coefficient $K^2$ considerably influencing on characteristics of the elastic wave device is not set to an optimum value, there is another problem that the insertion loss and/or pass band width in the conventional elastic wave device deteriorate.

SUMMARY OF THE INVENTION

An object of the present invention is to provide, with due consideration to the drawbacks of the conventional elastic wave device, an elastic wave device having characteristics of a broad band and a low loss.

An elastic wave device according to the present invention comprises a substrate of a piezo-electric element containing lithium niobate as a main component, and an electrode which is formed in a comb-like shape, is made of conductive material having a prescribed thickness and is arranged on the substrate. In particular, the elastic wave device is characterized in that a surface of the substrate is set to a plane which is obtained by rotating a plane perpendicular to a crystal Y-axis of the lithium niobate by an angle ranging from 55 degrees to 57 degrees around a crystal x-axis of the lithium niobate, and in that a duty ratio (w/p), which is determined according to both a width w of each of a plurality of electrode fingers composing the electrode and an arrangement interval p of each pair of electrode fingers, is equal to or higher than 0.4 and is lower than 1.0 for each electrode finger.

Therefore, there is an effect that an elastic wave device having characteristics of a broad band and a low loss as compared with those in the prior art can be obtained.

An elastic wave device according to the present invention comprises a substrate of a piezo-electric element containing lithium niobate as a main component, and an electrode which is formed in a comb-like shape, is made of conductive material having a prescribed thickness and is arranged on the substrate. In particular, the elastic wave device is characterized in that a surface of the substrate is set to a plane which is obtained by rotating a plane perpendicular to a crystal Y-axis of the lithium niobate by an angle ranging from 57 degrees to 62 degrees around a crystal x-axis of the lithium niobate, and in that a duty ratio (w/p), which is determined according to both a width w of each of a plurality of electrode fingers composing the electrode and an arrangement interval p of each pair of electrode fingers, is equal to or higher than 0.5 and is lower than 1.0 for each electrode finger.

Therefore, there is an effect that an elastic wave device having characteristics of a broad band and a low loss as compared with those in the prior art can be obtained.

An elastic wave device according to the present invention comprises a substrate of a piezo-electric element containing lithium niobate as a main component, and an electrode which is formed in a comb-like shape, is made of conductive material having a prescribed thickness and is arranged on the substrate. In particular, the elastic wave device is characterized in that a surface of the substrate is set to a plane which is obtained by rotating a plane perpendicular to a crystal Y-axis of the lithium niobate by an angle ranging from 62 degrees to 67 degrees around a crystal x-axis of the lithium niobate, and in that a duty ratio (w/p), which is determined according to both a width w of each of a plurality of electrode fingers composing the electrode and an arrangement interval p of each pair of electrode fingers, is equal to or higher than 0.6 and is lower than 1.0 for each electrode finger.

Therefore, there is an effect that an elastic wave device having characteristics of a broad band and a low loss as compared with those in the prior art can be obtained.

An elastic wave device according to the present invention comprises a substrate of a piezo-electric element containing lithium niobate as a main component, and an electrode which is formed in a comb-like shape, is made of conductive material having a prescribed thickness and is arranged on the substrate. In particular, the elastic wave device is characterized in that a surface of the substrate is set to a plane, which is obtained by rotating a plane perpendicular to a crystal Y-axis of the lithium niobate by an angle ranging from 67 degrees to 71 degrees around a crystal x-axis of the lithium niobate, and in that a duty ratio (w/p), which is determined according to both a width w of each of a plurality of electrode fingers composing the electrode and an arrangement interval p of each pair of electrode fingers, is equal to or higher than 0.7 and is lower than 1.0 for each electrode finger.

Therefore, there is an effect that an elastic wave device having characteristics of a broad band and a low loss as compared with those in the prior art can be obtained.

An elastic wave device according to the present invention comprises a substrate of a piezo-electric element containing lithium niobate as a main component, and an electrode which is formed in a comb-like shape, is made of conductive material having a prescribed thickness and is arranged on the substrate. In particular, the elastic wave device is characterized in that a surface of the substrate is set to a plane, which is obtained by rotating a plane perpendicular to a crystal Y-axis of the lithium niobate by an angle ranging from 71 degrees to 76 degrees around a crystal x-axis of the lithium niobate, and in that a duty ratio (w/p), which is determined according to both a width w of each of a plurality of electrode fingers composing the electrode and an arrangement interval p of each pair of electrode fingers, is equal to or higher than 0.8 and is lower than 1.0 for each electrode finger.

Therefore, there is an effect that an elastic wave device having characteristics of a broad band and a low loss as compared with those in the prior art can be obtained.

DETAILED DESCRIPTION OF THE PREFERRED EMBODIMENTS

The invention will now be described with reference to the accompanying drawings.

Embodiment 1

Figure 5:
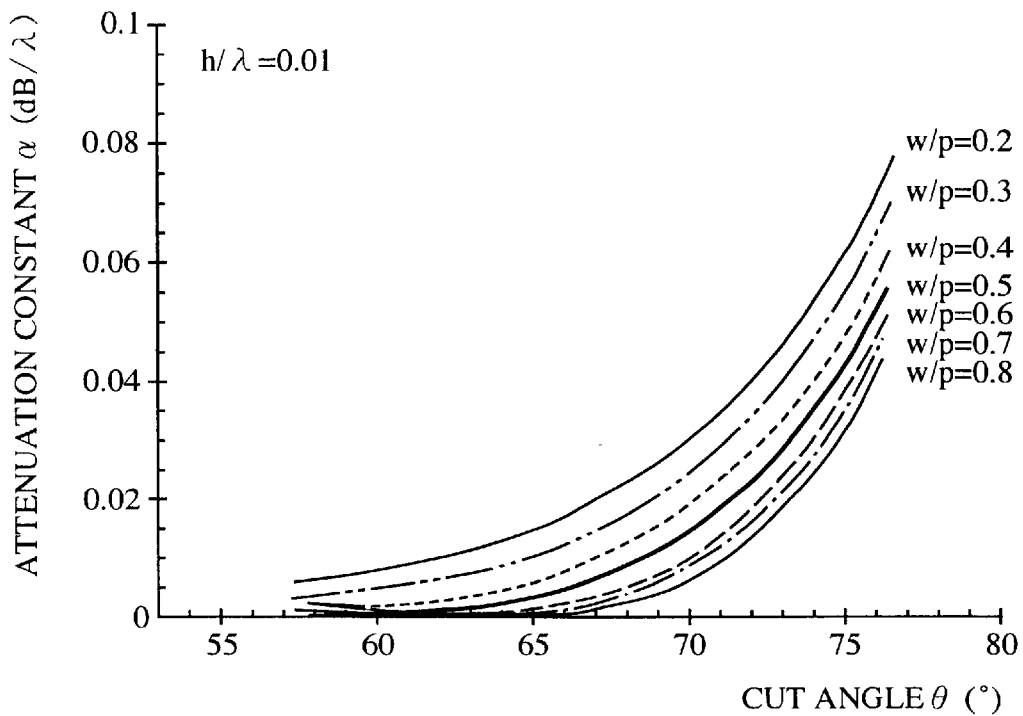
FIG. 5 is a diagram showing calculated results of an attenuation constant with respect to a cut angle of an LN substrate in case of a normalized electrode thickness set to 0.01 according to a first embodiment of the present invention.

FIG. 5 is a diagram showing calculated results of an attenuation constant α with respect to the cut angle θ in case of a normalized electrode thickness (h/λ) set to 0.01. In FIG. 5, a Y-axis indicates an attenuation constant α (dB/λ), and the attenuation constant α is the same as the propagation loss per wavelength indicated by the Y-axis of FIG. 1. An X-axis indicates a cut angle θ of the LN substrate 1. In the same manner as in FIG. 1, a propagation direction of the surface acoustic wave is set to a direction along a crystal X-axis of the LN substrate 1. Also, a surface of the LN substrate 1 is set to a plane perpendicular to an axis which is obtained by rotating a crystal Y-axis by an angle θ around the crystal x-axis. That is, a plane, which is obtained by rotating a plane perpendicular to the crystal Y-axis by an angle θ around the crystal x-axis, is set to a surface of the LN substrate 1.

Figure 2:
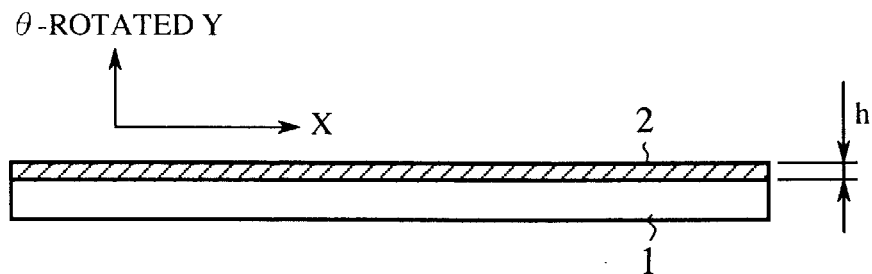
FIG. 2 is a cross sectional view of the conventional elastic wave device.

Here, the case where the whole surface of the LN substrate 1 is covered with the electrode 2 as shown in FIG. 2 is not adopted, but propagation characteristics of the surface acoustic wave are calculated in the case where an infinite number of electrode fingers 3 respectively having the width w are arranged at the arrangement intervals p. In FIG. 5, a ratio of the width w of each electrode finger 3 to the arrangement interval p is defined as a duty ratio (w/p), and calculation results are shown for seven duty ratios (w/p) ranging from 0.2 to 0.8 at 0.1 intervals.

Figure 6:
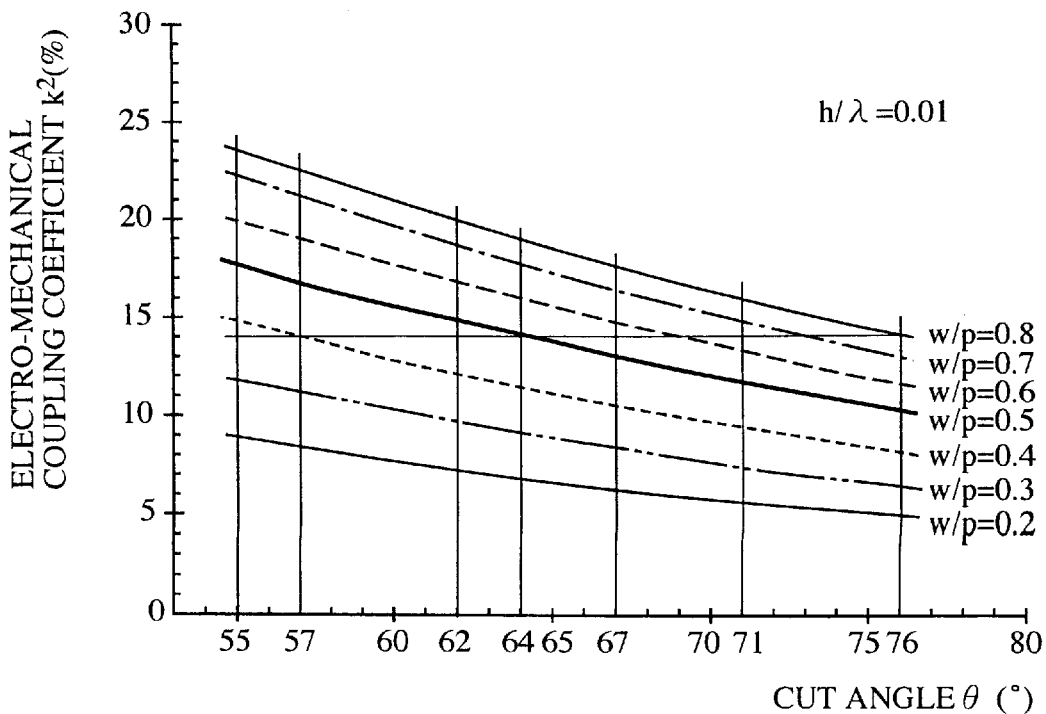
FIG. 6 is a diagram showing calculated results of an electro-mechanical coupling coefficient with respect to a cut angle of an LN substrate in case of a normalized electrode thickness set to 0.01 according to the first embodiment of the present invention.

FIG. 6 shows calculated results of an electro-mechanical coupling coefficient $K^2$. In FIG. 6, a Y-axis indicates an electro-mechanical coupling coefficient $K^2$. An X-axis indicates a cut angle θ of the LN substrate 1 in the same manner as in FIG. 5. Also, the calculated results for the same duty ratios (w/p) as those in FIG. 5 are shown.

The calculated results shown in FIG. 5 and FIG. 6 are obtained by adopting an analysis method using a discrete Green function which is, for example, disclosed in literatures: "Recent Research of Elastic Wave Device Technique", report of committee, 150-th Committee of Elastic Wave Device Technique held by the Japan Society for the promotion of Science in March of 1995, pp.649–654 (fourth literature) and pp.786–791 (fifth literature) and a literature of 23-th EM Symposium held in May of 1994 and written in pp.93–100 (sixth literature). The influence of backward scattering of a program (FEMSDA) described in the fifth literature is removed to obtain the calculated results.

Figure 1:
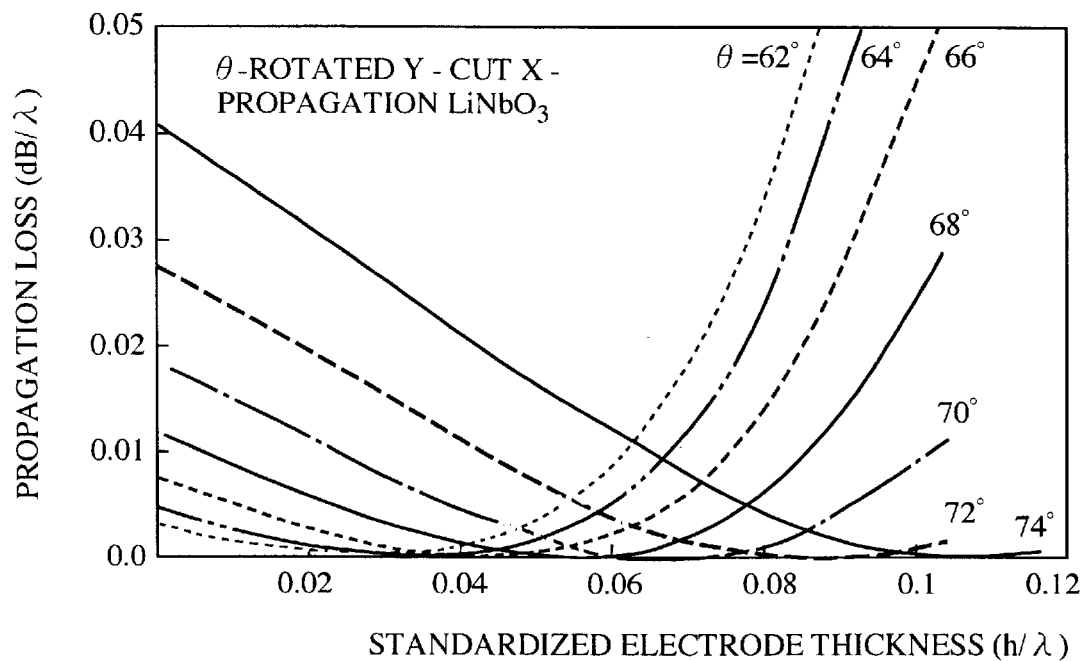
FIG. 1 is a diagram showing characteristics of a propagation loss with respect to a normalized electrode thickness in a conventional elastic wave device.

As to the calculation results shown in FIG. 1, though the analysis method for the calculation results shown in FIG. 1 differs from those shown in FIG. 5 and FIG. 6 because the calculation results shown in FIG. 1 is base on the case where the whole surface of the LN substrate 1 is covered with the electrode 2. However, the calculation results shown in FIG. 1 are obtained according to a calculation method using the same discrete Green function.

As is apparent in the calculation results shown in FIG. 5, in cases where the duty ratio (w/p) is, for example, equal to 0.5, the attenuation constant α is set to almost 0 as a minimum value in the vicinity of the cut angle θ set to 62 degrees. However, as shown in FIG. 1, in the calculation results obtained by applying the calculation method using the discrete Green function to the conventional elastic wave device, each calculation result in the range of the cut angle θ from 62 to 74 degrees does not have a minimum value in the vicinity of the normalized electrode thickness (h/λ) set to 0.01. The difference between the calculation results shown in FIG. 5 and the calculation results shown in FIG. 1 indicates that the propagation characteristic of the surface acoustic wave in the case where the whole surface of the LN substrate 1 is covered with the electrode 2 differs from that in the case of the structure of the electrode fingers 3 actually used.

Figure 7:
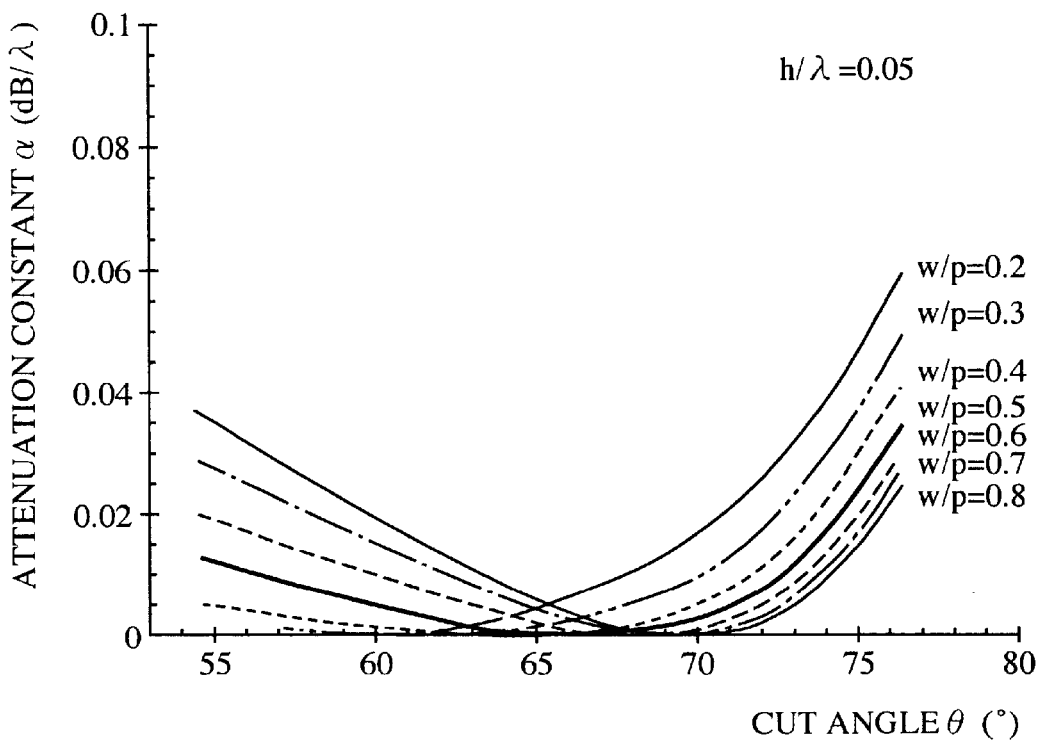
FIG. 7 is a diagram showing calculated results of an attenuation constant with respect to a cut angle of an LN substrate in case of a normalized electrode thickness set to 0.05 according to the first embodiment of the present invention.

In the same manner as the calculated results shown in FIG. 5 and FIG. 6, FIG. 7 and FIG. 8 show calculated results in case of the normalized electrode thickness (h/λ) set to 0.05. The normalized electrode thickness (h/λ) set to 0.05 is frequently used for the SAW device applied for a wave of a GHz band. In FIG. 7, as the duty ratio (w/p) is increased, a cut angle θ, at which the attenuation constant α is minimized, is increased.

Figure 8:
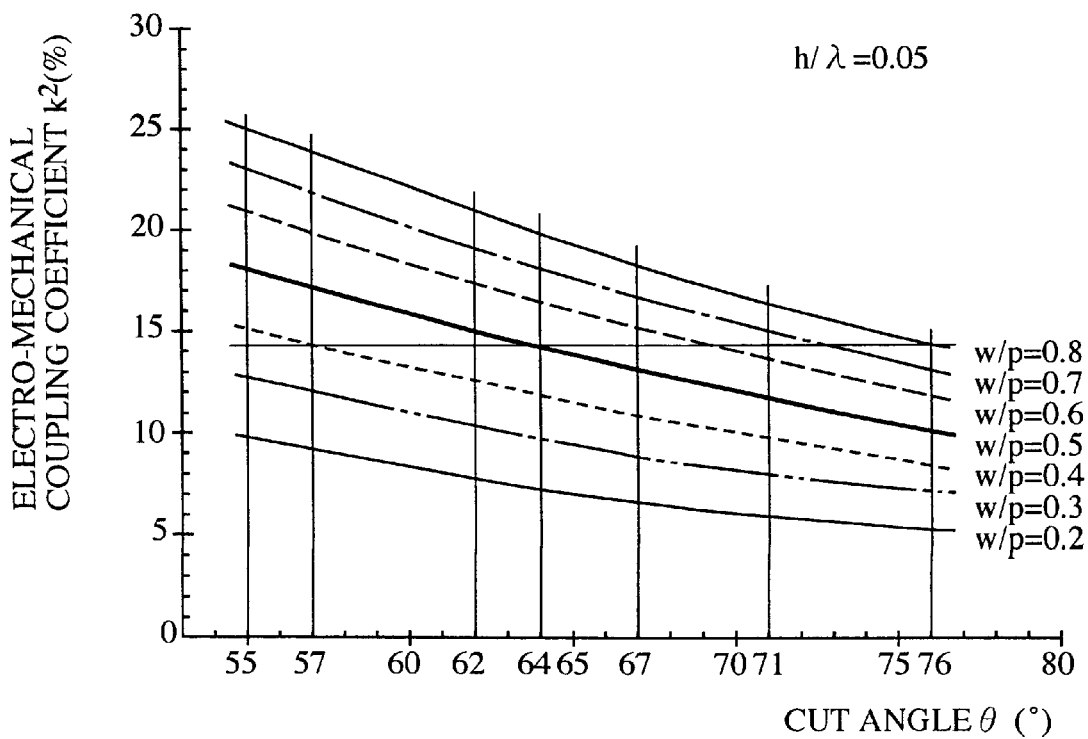
FIG. 8 is a diagram showing calculated results of an electro-mechanical coupling coefficient with respect to a cut angle of an LN substrate in case of a normalized electrode thickness set to 0.05 according to the first embodiment of the present invention.

However, in FIG. 8, as the selection of a cut angle θ is changed so as to decrease the attenuation constant α, is selected, it is realized that the electro-mechanical coupling coefficient $K^2$ is undesirably decreased. For example, in case of the duty ratio (w/p) set to 0.5, the attenuation constant α is minimized at the vicinity of the cut angle θ set to 66 degrees. However, the electro-mechanical coupling coefficient $K^2$ at a cut angle θ lower than 66 degrees is higher than that at the cut angle θ of 66 degrees.

In the same manner as the calculated results shown in FIG. 5, FIG. 6, FIG. 7 and FIG. 8, FIG. 9 and FIG. 10 show calculated results in case of the normalized electrode thickness (h/λ) set to 0.1. When the normalized electrode thickness (h/λ) is heightened, a cut angle θ, at which the attenuation constant α is minimized, is heightened as compared with the cut angle θ shown in FIG. 7. However, in the same manner as in FIG. 8, as the cut angle θ is decreased, the electro-mechanical coupling coefficient $K^2$ is increased.

Figure 10:
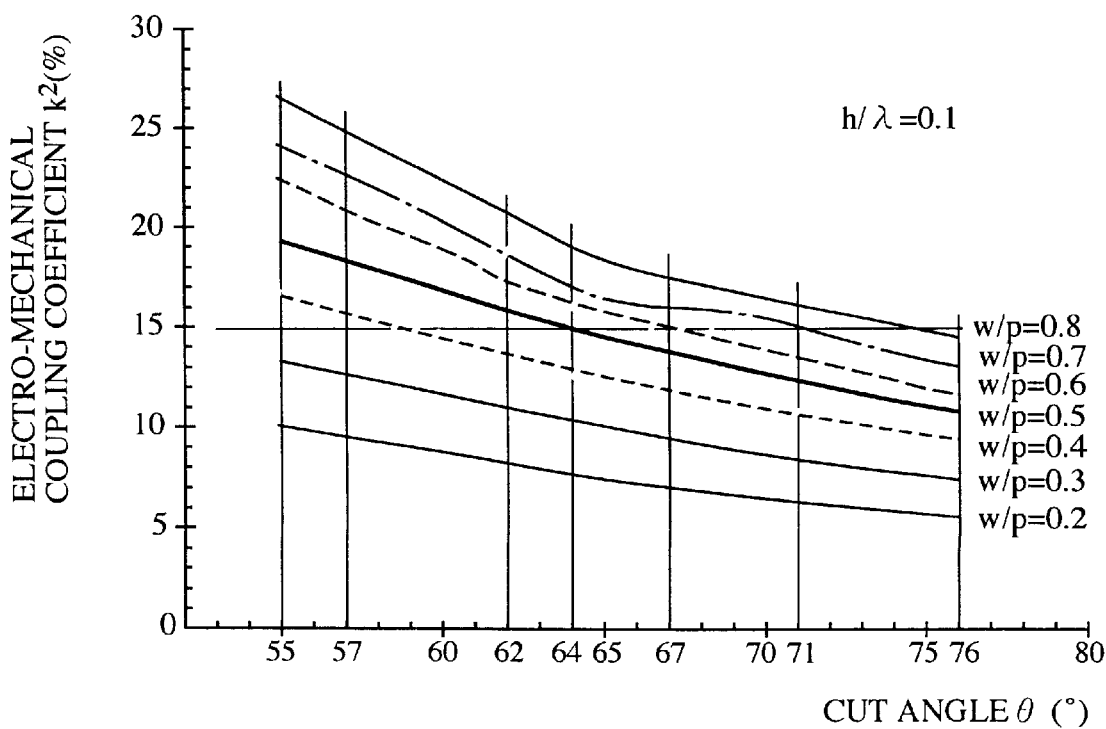
FIG. 10 is a diagram showing calculated results of an electro-mechanical coupling coefficient with respect to a cut angle of an LN substrate in case of a normalized electrode thickness set to 0.1 according to the first embodiment of the present invention.
Figure 11:
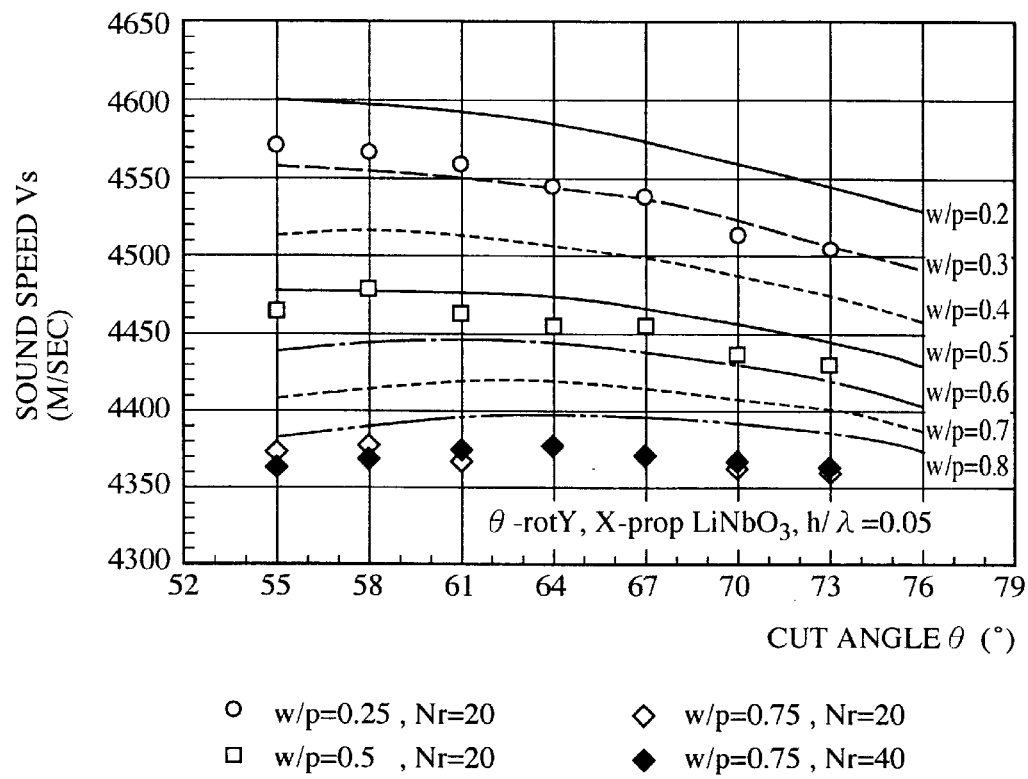
FIG. 11 is a diagram showing measured results of a sound velocity with respect to a cut angle of an LN substrate in case of a normalized electrode thickness set to 0.05 according to the first embodiment of the present invention.

FIG. 11 is a diagram in which calculation results are compared with measured results obtained by actually manufacturing an SAW filter to check the propriety of this calculation method. In FIG. 11, a Y-axis indicates a sound velocity Vs. An X-axis indicates a cut angle θ. A real line, a broken line, a dotted line, a dot-dash-line and the like indicate calculation results of sound velocity obtained according to the same calculation method as that adopted in FIG. 5 to FIG. 10, and the calculation results are shown in a range of the duty ratio (w/p) from 0.2 to 0.8 at 0.1 intervals.

Also, in FIG. 11, a symbol ○ indicates a measured result of a sound velocity obtained from an SAW filter which is manufactured by way of trial at the duty ratio (w/p) of 0.25. In the same manner, a symbol □ indicates a measured result of a sound velocity obtained from an SAW filter which is manufactured by way of trial at the duty ratio (w/p) of 0.5. A symbol ◇ and a symbol ◆ respectively indicate a measured result of a sound velocity obtained from an SAW filter which is manufactured by way of trial at the duty ratio (w/p) of 0.75. Also, all the calculation results and measured results are obtained in case of the normalized electrode thickness (h/λ) of 0.05, and a symbol Nr indicates the number of strips of a grating reflector arranged in the SAW filter.

Figure 12:
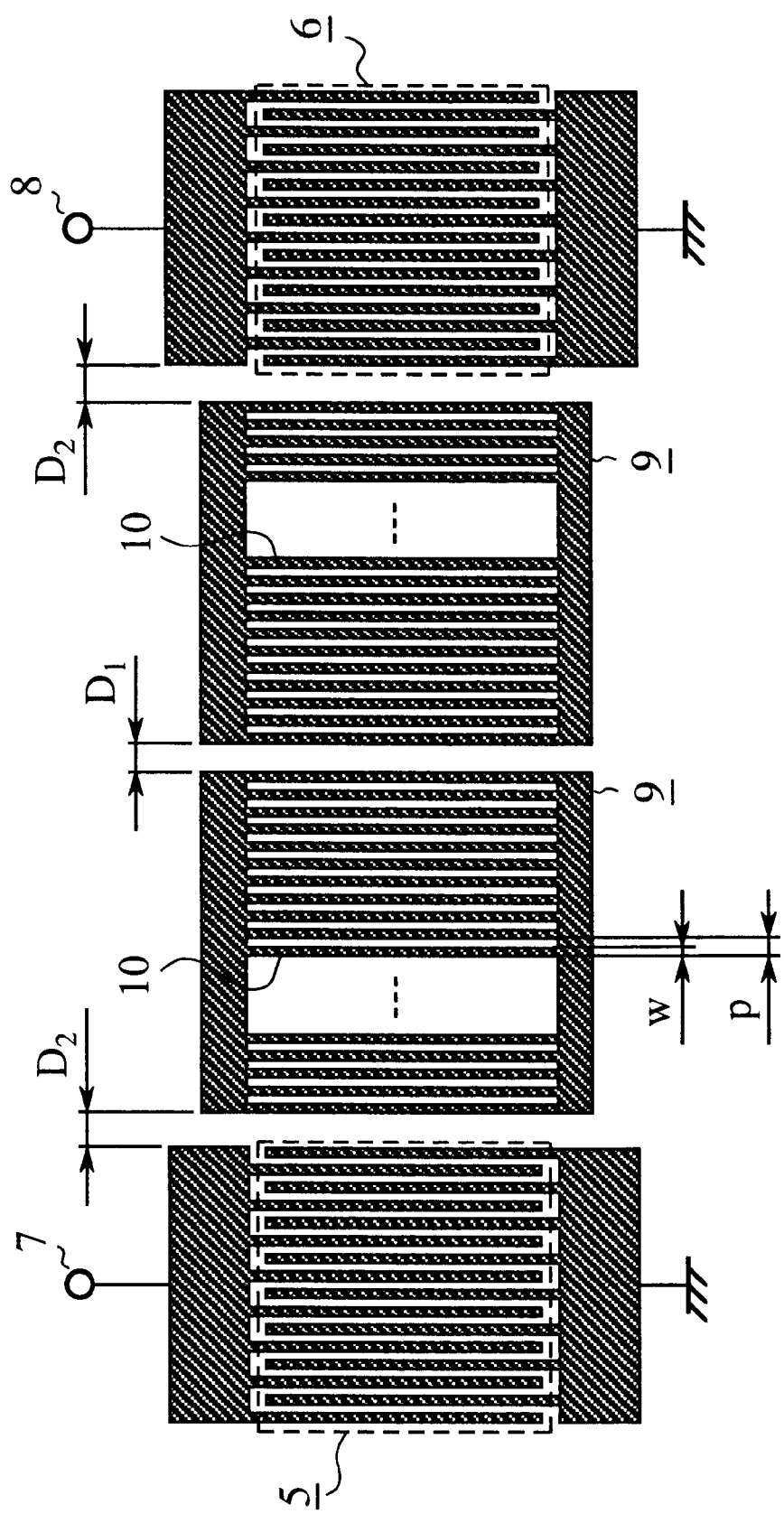
FIG. 12 is a typical diagram of a pattern for an SAW filter according to the first embodiment of the present invention.

FIG. 12 is a typical diagram of a pattern for an SAW filter used to obtain the measured results shown in FIG. 11. This pattern is, for example, disclosed in a literature: "Surface Wave Device and its Application", edited by Electro-Material Industries Association, December of 1978, published by Nikkan Kogyo Newspaper company, pp.153–155 (seventh literature). Two grating reflectors 9 are arranged between the input-side IDT 5 and the output-side IDT 6, and a distance D1 between the two grating reflectors 9 is set to be equal to the arrangement intervals p of reflector strips of the grating reflectors 9.

Figure 13:
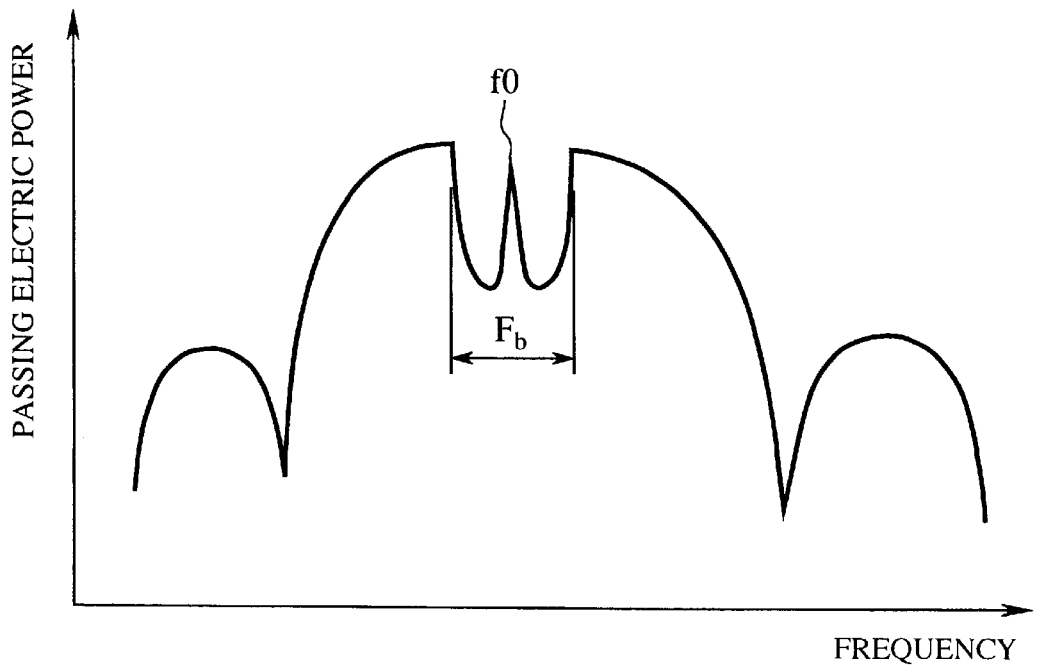
FIG. 13 is a diagram showing a characteristic of a passing electric power with respect to a frequency of the SAW filter shown in FIG. 12 according to the first embodiment of the present invention.

Therefore, by arranging the grating reflectors 9 as is described, a passing electric power (that is, an electric power of an electric signal set to a frequency of a pass band) from the input terminal 7 to the output terminal 8 indicates a characteristic shown in FIG. 13. That is, a surface acoustic wave of a specific frequency is selectively reflected in the grating reflectors 9. In FIG. 13, f0 is equivalent to a center frequency in the grating reflectors 9, and Fb is equivalent to a stop band width in the grating reflectors 9.

The arrangement interval p of the grating reflectors 9 is equal to half of a wavelength corresponding to the center frequency f0 in the grating reflectors 9. Therefore, a value, which is obtained by multiplying the center frequency f0 by a value 2p equal to double of the arrangement interval p, is equal to a sound speed Vs. FIG. 11 shows the value (Vs=2p*f0) of the sound speed Vs. Here, the symbol Nr shown in FIG. 11 indicates the number of strips respectively having the line width w in each grating reflector 9. Also, a distance D2 does not considerably influence on the characteristic shown in FIG. 13.

As shown in FIG. 12, because all shorted strips 10 of each grating reflector 9 are set to the same electric potential, characteristics in the shorted strips 10 are almost the same as those in the electrode fingers 3. Therefore, the material constants such as the sound speed Vs, the attenuation constant α, the electro-mechanical coupling coefficient $K^2$ and the like in the shorted strips 10 are almost the same as those in the electrode fingers 3 which have the same duty ratio (w/p) as that of the shorted strips 10. As is apparent in FIG. 11, the calculation values almost agree with the measured values. Therefore, it is realized that the calculation is performed on the basis of an assumed operation condition closely approximating to an actual operation condition of the SAW filter, and the calculation values reproduce the measured values with high accuracy.

Figure 14:
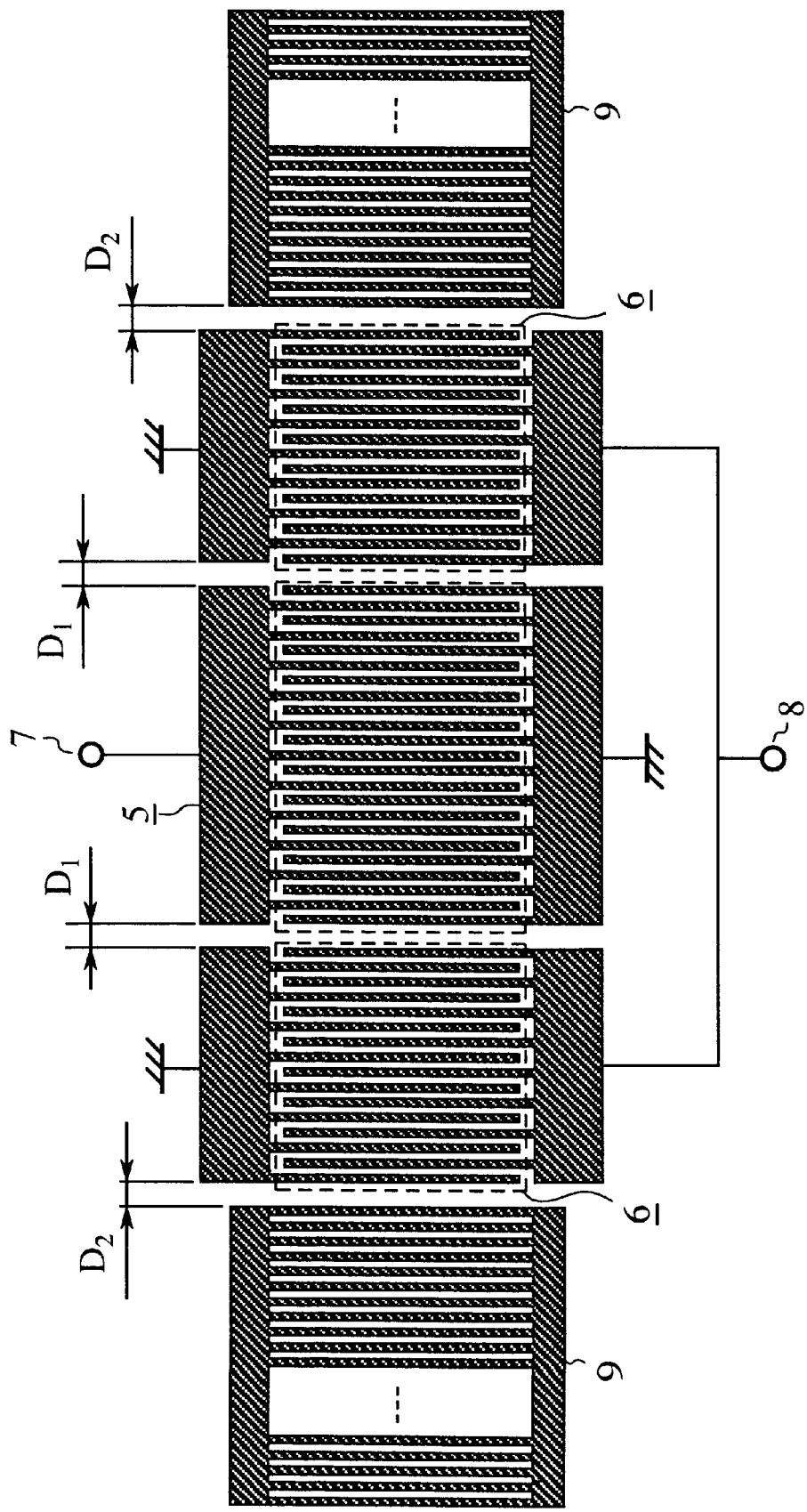
FIG. 14 is a typical diagram of a pattern for a mode coupling type SAW resonance filter according to the first embodiment of the present invention.

FIG. 14 shows an example of a pattern for a mode coupling type SAW resonance filter. The calculation results shown in FIG. 5 to FIG. 10 are used to ascertain the effect given to the mode coupling type SAW resonance filter. In FIG. 14, 5 indicates an input-side IDT. The number of electrode fingers 3 is 23. 6 indicates an output-side IDT. Two output-side IDTs 6 arranged in parallel to each other are electrically connected with each other. The number of electrode fingers 3 in each output-side IDT 6 is 16. 9 indicates a grating reflector. The number of strips in each grating reflector 9 is 130. A line width of each electrode finger 3 of the input-side IDT 5 and a line width of each electrode finger 3 of the output-sides IDT 6 are set to the same value wi, and arrangement intervals of the electrode finger 3 of both the input-side IDT 5 and the output-sides IDT 6 are set to the same value pi.

Arrangement intervals pg of strips of the grating reflectors 9 shown in FIG. 14 differ from the arrangement intervals pi in both the input-side IDT 5 and the output-sides IDT 6 and are set to pg=1.0226*pi. However, a duty ratio (wg/pg) of each strip of the grating reflectors 9 is set to be the same as a duty ratio (wi/pi) of each electrode finger 3 of both the input-side IDT 5 and the output-sides IDT 6. Therefore, the duty ratio (wi/pi) and the duty ratio (wg/pg) are generally called a duty ratio (w/p).

Also, the distance D1 is set to 2.5p, and the distance D2 is set to 0.25p. In cases where the cut angle θ or the duty ratio (w/p) is changed, the sound velocity Vs is changed. However, the arrangement interval pi is changed so as to set the center frequency f0 of both the input-side IDT 5 and the output-sides IDT 6 to 839.29 MHz, and calculation results are obtained. A maximum aperture width W0 is set to 440 μm.

Figure 15:
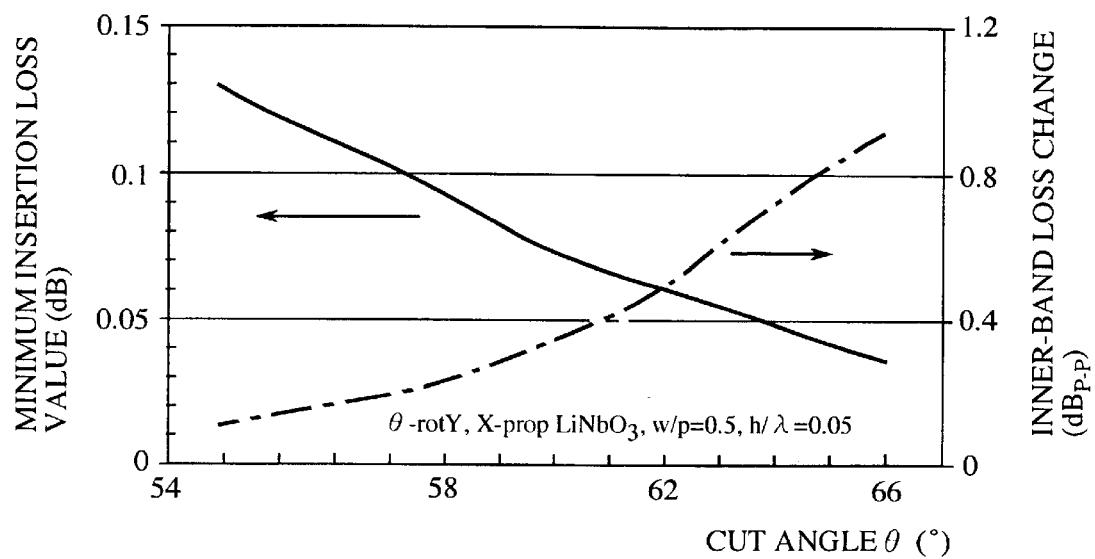
FIG. 15 is a diagram showing calculated results of a minimum insertion loss value in the mode coupling type SAW resonance filter shown in FIG. 14 according to the first embodiment of the present invention.

In FIG. 15, calculated results of a minimum insertion loss value and calculated results of an inner-band loss change in the mode coupling type SAW resonance filter shown in FIG. 14 are plotted. In this calculation, for example, a second model of an equivalent circuit, which is proposed by Smith in a literature: "Handbook of Elastic Wave Device Technique", 150-th Committee of Elastic Wave Device Technique held by the Japan Society for the promotion of Science, November of 1991, pp.185–205 (eighth literature), is used for both the input-side IDT5 and the output-side IDTs 6.

Also, a distributed constant type equivalent circuit, which is disclosed in a literature: "Handbook of Elastic Wave Device Technique", 150-th Committee of Elastic Wave Device Technique held by the Japan Society for the promotion of Science, November of 1991, pp.206–227 (ninth literature), is, for example, used for the calculation of the grating reflectors 9. The grating reflectors 9 are the same as a circuit which is obtained by shortening electric terminals of the equivalent circuit shown in the ninth literature. In FIG. 5 to FIG. 10, the attenuation constant α and the electro-mechanical coupling coefficient $K^2$ are shown. However, because material constants such as a sound speed Vs, an electrostatic capacitance C0 and a reflection coefficient C1 are changed with the duty ratio (w/p), the change of these material constants is considered to obtain the calculation results shown in FIG. 15. Here, the calculation results shown in FIG. 15 are obtained in case of the normalized electrode thickness (h/λ) set to 0.05 and the duty ratio (w/p) set to 0.5.

In the calculation results shown in FIG. 15, a minimum insertion loss value at the cut angle θ of 66 degrees is lower than that at the cut angle θ of 55 degrees. However, an inner-band loss change, which is defined as a difference between a minimum insertion loss value and a maximum insertion loss value in a pass band, is low in case of the cut angle θ of 55 degrees as compared with the inner-band loss change at the cut angle θ of 66 degrees. As shown in FIG. 7, as the cut angle θ is decreased from 66 degrees, the attenuation constant α is increased. Therefore, as the cut angle θ is decreased from 66 degrees, the minimum insertion loss value is increased. However, as shown in FIG. 8, as the cut angle θ is decreased from 66 degrees, the electro-mechanical coupling coefficient $K^2$ is increased. Here, in cases where the inner-band loss change is low, a band width of surface acoustic waves useful in the elastic wave device can be broadened. Therefore, because the electro-mechanical coupling coefficient $K^2$ at the cut angle θ of 55 degrees is higher than that at the cut angle θ of 66 degrees, the band width of surface acoustic waves useful in the elastic wave device in case of the cut angle θ of 55 degrees is broader than that in case of the cut angle θ of 66 degrees. For example, in cases where it is required to set the inner-band loss change to a value lower than 0.5 dB, it is impossible to set the inner-band loss change to a value lower than 0.5 in the conventional elastic wave device in which the cut angle θ is set to a value higher than 64 degrees, and it is required to set the cut angle θ to a value lower than 62 degrees. In cases where the cut angle θ of 55 degrees is adopted, though the minimum insertion loss value is higher than that at the cut angle θ of 64 degrees, a difference in the minimum insertion loss value between the cut angle θ of 55 degrees and the cut angle θ of 64 degrees is almost only 0.05 dB.

Figure 16:
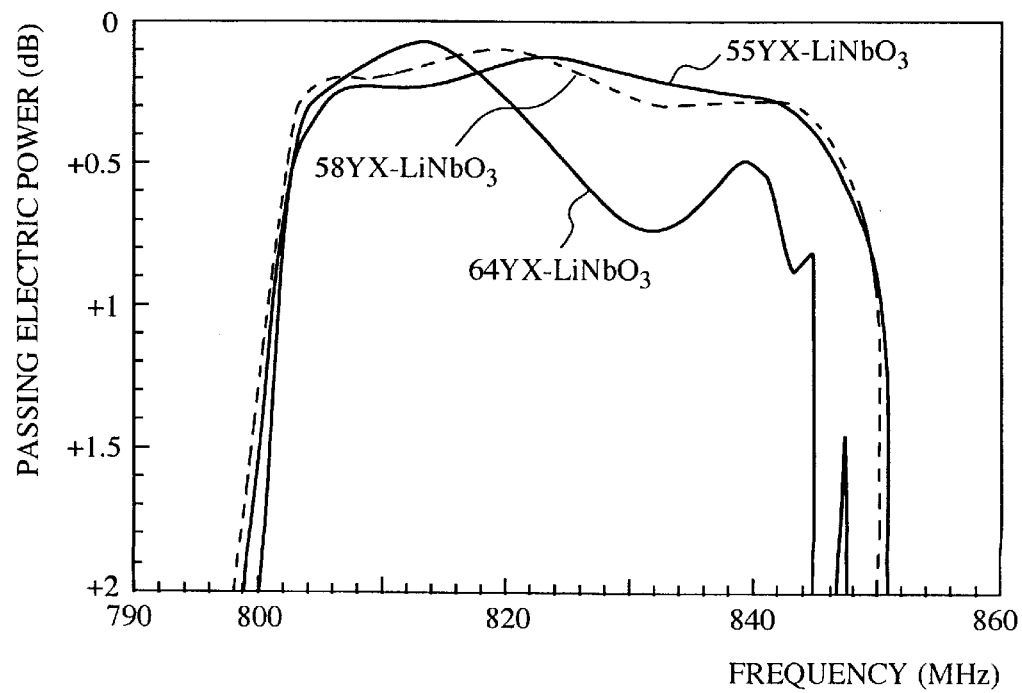
FIG. 16 is a diagram showing characteristics of a passing electric power with respect to a frequency in the mode coupling type SAW resonance filter shown in FIG. 14 according to the first embodiment of the present invention.

FIG. 16 is a diagram showing calculation results of a pass band characteristic in case of the cut angle θ of 64 degrees (64-YXLiNbO$_3$), the cut angle θ of 58 degrees (58-YXLiNbO$_3$) and the cut angle θ of 55 degrees (55-YXLiNbO$_3$). A pattern for the SAW filter is shown in FIG. 14. To determine calculation conditions, the normalized electrode thickness (h/λ) is set to 0.05, and the duty ratio (w/p) is set to 0.5.

Also, to determine other calculation conditions, in case of the cut angle θ of 64 degrees, the sound speed Vs is set to 4465 (m/s), the attenuation constant α is set to 0.0108 (dB/λ), the electrostatic capacitance C0 is set to 250 (pF/m) per one electrode finger, and the electro-mechanical coupling coefficient $K^2$ is set to 13.5% In case of the cut angle θ of 58 degrees, the sound speed Vs is set to 4477 (m/s), the attenuation constant α is set to 0.012 (dB/λ), the electrostatic capacitance C0 is set to 285 (pF/m) per one electrode finger, and the electro-mechanical coupling coefficient $K^2$ is set to 18%. In case of the cut angle θ of 55 degrees, the sound speed Vs is set to 4477 (m/s), the attenuation constant α is set to 0.0076 (dB/λ), the electrostatic capacitance C0 is set to 277 (pF/m) per one electrode finger, and the electro-mechanical coupling coefficient $K^2$ is set to 16.7%.

In both the case of the cut angle θ of 55 degrees and the case of the cut angle θ of 58 degrees, the minimum insertion loss values, which are respectively calculated when a passing electric power shown in FIG. 16 reaches a maximum value, are slightly higher than that at the case of the cut angle θ of 64 degrees. However, the minimum insertion loss values at the cut angles θ of 55 degrees, 58 degrees and 64 degrees are substantially the same as each other. In contrast, a flatness of the passing electric power at each of the cut angles θ of 55 degrees and 58 degrees is broadened in the pass band as compared with that at the cut angle θ of 64 degrees. For example, the insertion loss at each of the cut angles θ of 55 degrees and 58 degrees is low at a frequency ranging from 804 MHz to 842 MHz as compared with that at the cut angle θ of 64 degrees. That is, the insertion loss at each of the cut angles θ of 55 degrees and 58 degrees is low at a required frequency band as compared with that at the cut angle θ of 64 degrees adopted in the prior art. In other words, a band of surface acoustic waves, which are useful for an SAW filter corresponding to the cut angle θ of 55 degrees or 58 degrees, is broader than that corresponding to the cut angle θ of 64 degrees adopted in the prior art.

Also, as is apparent in FIG. 16, a pass band width corresponding to each of the cut angles θ of 55 degrees and 58 degrees is broader than that corresponding to the cut angle θ of 64 degrees adopted in the prior art. Accordingly, it is realized that the influence of the electro-mechanical coupling coefficient $K^2$ on the performance (in particular, the insertion loss and the band width) of an SAW filter is larger than that of the attenuation constant α. Here, a phrase "characteristics of a broad band and a low insertion loss as compared with those in the prior art" in this specification denotes a characteristic of a pass band width broader than that in the prior art at the same insertion loss as that in the prior art or a characteristic of an insertion loss lower than that in the prior art at the same pass band width as that in the prior art.

As shown in FIG. 8, in cases where the duty ratio (w/p) is equal to or higher than 0.4, the electro-mechanical coupling coefficient $K^2$ in a range of the cut angle θ from 55 degrees to 57 degrees is higher than that at the cut angle θ of 64 degrees adopted in the prior art. Because the electro-mechanical coupling coefficient $K^2$ does not depend on the normalized electrode thickness (h/λ) so much in the range of the cut angle θ and the duty ratio (w/p), the same result is obtained for the electro-mechanical coupling coefficient $K^2$ shown in each of FIG. 6 and FIG. 10.

However, in cases where the normalized electrode thickness (h/λ) is set to a high value such as 0.1, though the electro-mechanical coupling coefficient $K^2$ is increased as the duty ratio (w/p) is increased, the attenuation constant α is also increased as the duty ratio (w/p) is increased. Therefore, there is a possibility that the insertion loss in the SAW filter is undesirably increased. To avoid the increase of the insertion loss, it is preferred that the cut angle θ and the duty ratio (w/p) are appropriately adjusted so as to satisfy characteristics required in the SAW filter.

As is described above, in the first embodiment, in cases where the duty ratio (w/p) is equal to or higher than 0.4 and is lower than 1.0 in a range of the cut angle θ from 55 degrees to 57 degrees, there is an effect that an elastic wave device having characteristics of a broad band and a low loss as compared with those in the prior art can be obtained.

Embodiment 2

Figure 9:
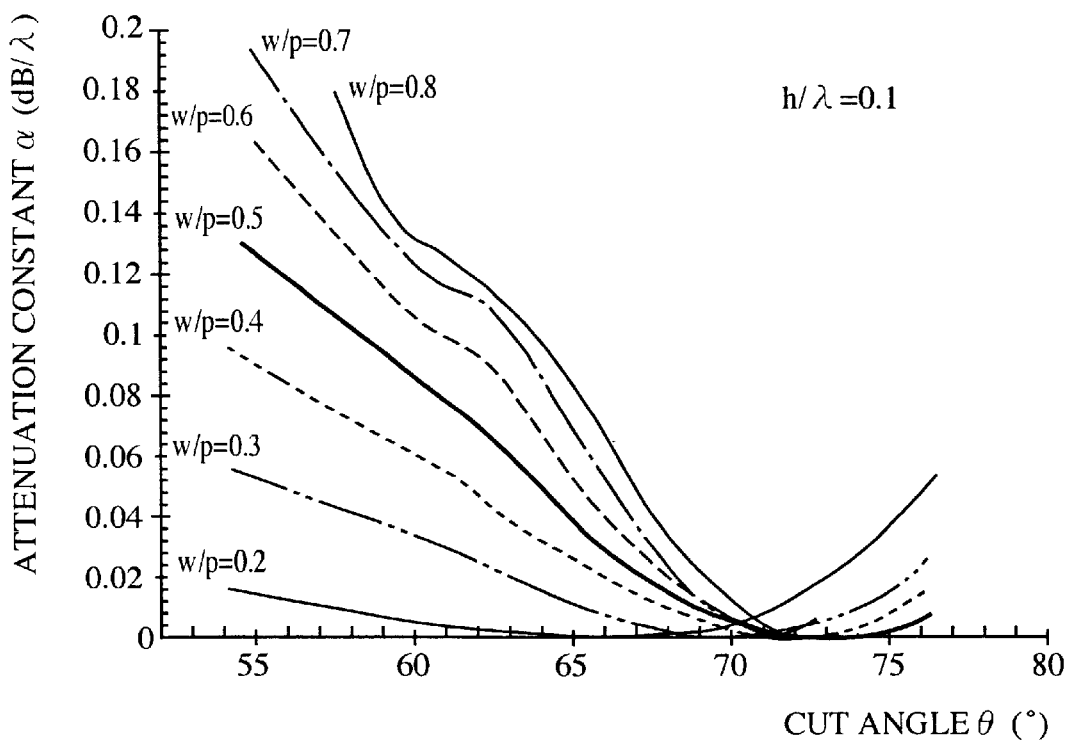
FIG. 9 is a diagram showing calculated results of an attenuation constant with respect to a cut angle of an LN substrate in case of a normalized electrode thickness set to 0.1 according to the first embodiment of the present invention.

In the same manner, as shown in FIG. 8, in cases where the duty ratio (w/p) is equal to or higher than 0.5, the electro-mechanical coupling coefficient $K^2$ in a range of the cut angle θ from 57 degrees to 62 degrees is higher than that at the cut angle θ of 64 degrees adopted in the prior art. The same result is obtained for the electro-mechanical coupling coefficient $K^2$ shown in FIG. 6. Also, in cases where the electro-mechanical coupling coefficient $K^2$ shown in FIG. 10, which is calculated for the normalized electrode thickness (h/λ) of the high value, is compared with that shown in FIG. 8 which is calculated for the normalized electrode thickness (h/λ) of the comparatively low value, the electro-mechanical coupling coefficient $K^2$ shown in FIG. 10 is higher than that shown in FIG. 8 at the same cut angle θ and the same duty ratio (w/p) in case of the duty ratio (w/p) equal to or higher than 0.5 in the range of the cut angle θ from 57 degrees to 62 degrees. In contrast, in cases where the attenuation constant α shown in FIG. 9 is compared with that shown in FIG. 7, the attenuation constant α shown in FIG. 9 is higher than that shown in FIG. 7 at the same cut angle θ and the same duty ratio (w/p) in case of the duty ratio (w/p) equal to or higher than 0.5 in the range of the cut angle θ from 57 degrees to 62 degrees. In particular, as the duty ratio (w/p) is increased in case of the duty ratio (w/p) equal to or higher than 0.5 in the range of the cut angle θ from 57 degrees to 62 degrees, though the electro-mechanical coupling coefficient $K^2$ is increased, the attenuation constant α is also undesirably increased.

Therefore, there is a possibility that the insertion loss in the SAW filter is undesirably increased. To avoid the increase of the insertion loss, it is preferred that the cut angle θ and the duty ratio (w/p) are appropriately adjusted so as to satisfy characteristics required in the SAW filter. However, because the electro-mechanical coupling coefficient $K^2$ itself is heightened, the pass band width is broadened. That is, an elastic wave device having characteristics of a broad band and a low loss can be obtained. As is described above, in the second embodiment, in cases where the duty ratio (w/p) is equal to or higher than 0.5 and is lower than 1.0 in the range of the cut angle θ from 57 degrees to 62 degrees, there is an effect that an elastic wave device having characteristics of a broad band and a low loss as compared with those in the prior art can be obtained.

Embodiment 3

In the same manner, as shown in FIG. 8, in cases where the duty ratio (w/p) is equal to or higher than 0.6, the electro-mechanical coupling coefficient $K^2$ in a range of the cut angle θ from 62 degrees to 67 degrees is higher than that at the cut angle θ of 64 degrees adopted in the prior art. The same result is obtained for the electro-mechanical coupling coefficient $K^2$ shown in FIG. 6. Also, in cases where the electro-mechanical coupling coefficient $K^2$ shown in FIG. 10, which is calculated for the normalized electrode thickness (h/λ) of the high value, is compared with that shown in FIG. 8 which is calculated for the normalized electrode thickness (h/λ) of the comparatively low value, the electro-mechanical coupling coefficient $K^2$ shown in FIG. 10 is almost the same as that shown in FIG. 8 at the same cut angle θ and the same duty ratio (w/p) in case of the duty ratio (w/p) equal to or higher than 0.6 in the range of the cut angle θ from 62 degrees to 67 degrees. In contrast, in cases where the attenuation constant α shown in FIG. 9 is compared with that shown in FIG. 7, the attenuation constant α shown in FIG. 9 is higher than that shown in FIG. 7 at the same cut angle θ and the same duty ratio (w/p) in case of the duty ratio (w/p) equal to or higher than 0.6 in the range of the cut angle θ from 62 degrees to 67 degrees. In particular, as the duty ratio (w/p) is increased in case of the duty ratio (w/p) equal to or higher than 0.6 in the range of the cut angle θ from 62 degrees to 67 degrees, though the electro-mechanical coupling coefficient $K^2$ is increased, the attenuation constant α is also undesirably increased.

Therefore, there is a possibility that the insertion loss in the SAW filter is undesirably increased. To avoid the increase of the insertion loss, it is preferred that the cut angle θ and the duty ratio (w/p) are appropriately adjusted so as to satisfy characteristics required in the SAW filter. However, because the electro-mechanical coupling coefficient $K^2$ itself is heightened, the pass band width is broadened. That is, an elastic wave device having characteristics of a broad band can be obtained.

As is described above, in the third embodiment, in cases where the duty ratio (w/p) is equal to or higher than 0.6 and is lower than 1.0 in the range of-the cut angle θ from 62 degrees to 67 degrees, there is an effect that an elastic wave device having characteristics of a broad band and a low loss as compared with those in the prior art can be obtained.

Embodiment 4

In the same manner, as shown in FIG. 8, in cases where the duty ratio (w/p) is equal to or higher than 0.7, the electro-mechanical coupling coefficient $K^2$ in a range of the cut angle θ from 67 degrees to 71 degrees is higher than that at the cut angle θ of 64 degrees adopted in the prior art. The same result is obtained for the electro-mechanical coupling coefficient $K^2$ shown in FIG. 6. Also, in cases where the electro-mechanical coupling coefficient $K^2$ shown in FIG. 10, which is calculated for the normalized electrode thickness (h/λ) of the high value, is compared with that shown in FIG. 8 which is calculated for the normalized electrode thickness (h/λ) of the comparatively low value, the electro-mechanical coupling coefficient $K^2$ shown in FIG. 10 is almost the same as that shown in FIG. 8 at the same cut angle θ and the same duty ratio (w/p) in case of the duty ratio (w/p) equal to or higher than 0.7 in the range of the cut angle θ from 67 degrees to 71 degrees. Also, in cases where the attenuation constant α shown in FIG. 9 is compared with that shown in FIG. 7, though the attenuation constant α shown in FIG. 9 is higher than that shown in FIG. 7 at the same cut angle θ and the same duty ratio (w/p) in case of the duty ratio (w/p) equal to or higher than 0.7 in the range of the cut angle θ from 67 degrees to 71 degrees, a rate of the change of the attenuation constant α with the cut angle θ and the duty ratio (w/p) is not so high. Therefore, it is preferred that the cut angle θ and the duty ratio (w/p) are appropriately adjusted so as to satisfy characteristics required in the SAW filter.

As is described above, in the fourth embodiment, in cases where the duty ratio (w/p) is equal to or higher than 0.7 and is lower than 1.0 in the range of the cut angle θ from 67 degrees to 71 degrees, there is an effect that an elastic wave device having characteristics of a broad band and a low loss as compared with those in the prior art can be obtained.

Embodiment 5

In the same manner, as shown in FIG. 8, in cases where the duty ratio (w/p) is equal to or higher than 0.8, the electro-mechanical coupling coefficient $K^2$ in a range of the cut angle θ from 71 degrees to 76 degrees is higher than that at the cut angle θ of 64 degrees adopted in the prior art. The same result is obtained for the electro-mechanical coupling coefficient $K^2$ shown in FIG. 6. Also, in cases where the electro-mechanical coupling coefficient $K^2$ shown in FIG. 10, which is calculated for the normalized electrode thickness (h/λ) of the high value, is compared with that shown in FIG. 8 which is calculated for the normalized electrode thickness (h/λ) of the comparatively low value, the electro-mechanical coupling coefficient $K^2$ shown in FIG. 10 is almost the same as that shown in FIG. 8 at the same cut angle θ and the same duty ratio (w/p) in case of the duty ratio (w/p) equal to or higher than 0.8 in the range of the cut angle θ from 71 degrees to 76 degrees. Also, in cases where the attenuation constant α shown in FIG. 9 is compared with that shown in FIG. 7, the attenuation constant α shown in FIG. 9 is lower than that shown in FIG. 7 at the same cut angle θ and the same duty ratio (w/p) in case of the duty ratio (w/p) equal to or higher than 0.8 in the range of the cut angle θ from 71 degrees to 76 degrees. Therefore, because the effect obtained in the heightening of the electro-mechanical coupling coefficient $K^2$ influences on the characteristics of an elastic wave device as it is, an elastic wave device having characteristics of a broad band and a low loss as compared with those in the prior art can be obtained.

As is described above, in cases where the duty ratio (w/p) is equal to or higher than 0.8 and is lower than 1.0 in the range of the cut angle θ from 71 degrees to 76 degrees, there is an effect that an elastic wave device having characteristics of a broad band and a low loss as compared with those in the prior art can be obtained.

Figure 3:
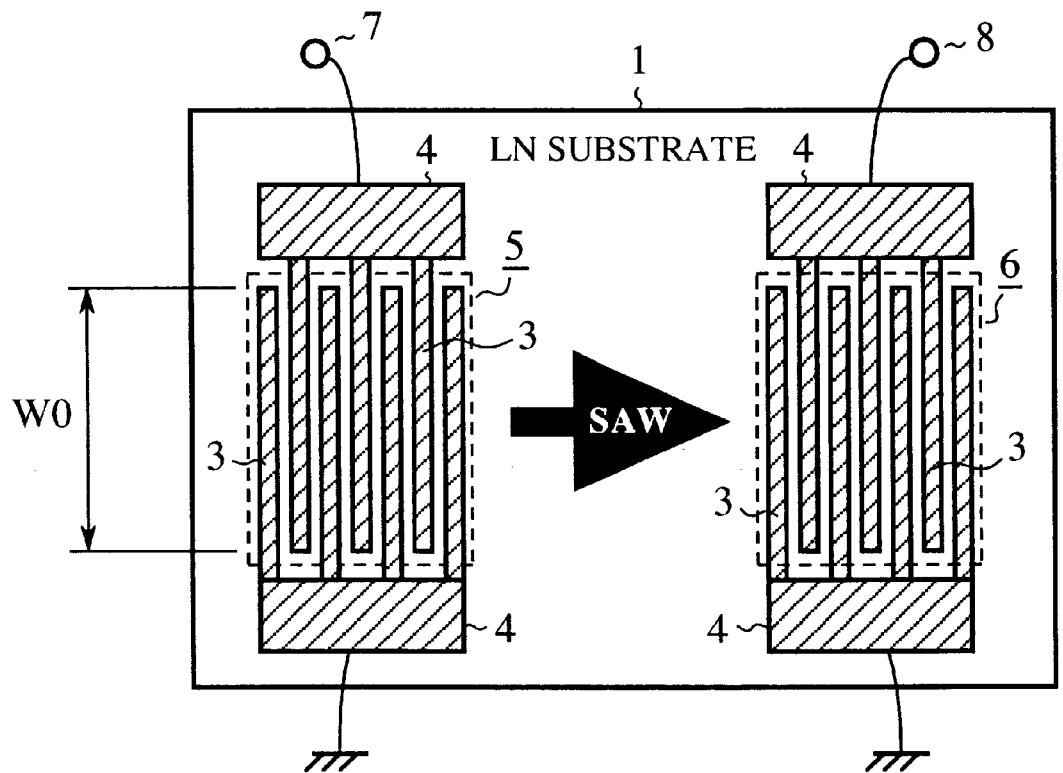
FIG. 3 is a diagram showing the configuration of an elastic wave device.
Figure 4:
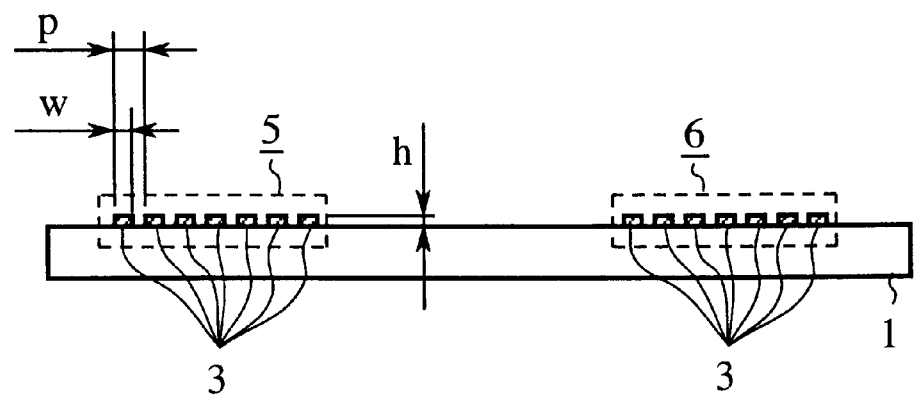
FIG. 4 is a cross sectional view of the elastic wave device.

The characteristics of the elastic wave device are described by using the mode coupling type SAW resonance filter shown in FIG. 14 as an example. However, the present invention is not limited to the mode coupling type SAW resonance filter, and the number of IDTs is not limited to 3. That is, the same effect can be obtained in an elastic wave device having an arbitrary number of IDTs. Also, even though the present invention is applied to a so-called transversal type filter having a multi-electrode structure or the SAW filter having-the simple structure shown in FIG. 3, the same effect can be obtained.

Also, the case where all the arrangement intervals of the electrode fingers 3 are the same as each other is described. However, even though a part of the arrangement intervals differ from the other part of arrangement intervals or the arrangement intervals differ from each other, the same effect can be obtained. Also, even though a floating electrode exists in one IDT or a plurality of floating electrodes existing in one IDT are electrically connected with each other, the same effect can be obtained.

Also, the present invention is not limited to the SAW filter. That is, the present invention is appropriate to all types of SAW devices in which IDTs having a transformation function between an electric signal and LSAW or SSBW are arranged. Also, the present invention is appropriate to all types of elastic wave devicees respectively using one of these SAW devices.

As is described above, the present invention is appropriate to the elastic wave device having characteristics of a broad band and a low loss.

What is claimed is:

1. An elastic wave device, comprising
   a substrate of a piezo-electric element containing lithium niobate as a main component; and
   an electrode arranged on the substrate, the electrode being formed in a comb-like shape, and the electrode being made of conductive material having a prescribed thickness, wherein
      a surface of the substrate is set to a plane which is obtained by rotating a plane perpendicular to a crystal Y-axis of the lithium niobate by an angle ranging from 55 degrees to 57 degrees around a crystal x-axis of the lithium niobate, and
      a duty ratio (w/p), which is determined according to both a width w of each of a plurality of electrode fingers composing the electrode and an arrangement interval p of each pair of electrode fingers, is equal to or higher than 0.4 and is lower than 1.0 for each electrode finger.

2. An elastic wave device, comprising
   a substrate of a piezo-electric element containing lithium niobate as a main component; and
   an electrode arranged on the substrate, the electrode being formed in a comb-like shape, and the electrode being made of conductive material having a prescribed thickness, wherein
      a surface of the substrate is set to a plane which is obtained by rotating a plane perpendicular to a crystal Y-axis of the lithium niobate by an angle ranging from 57 degrees to 62 degrees around a crystal x-axis of the lithium niobate, and
      a duty ratio (w/p), which is determined according to both a width w of each of a plurality of electrode fingers composing the electrode and an arrangement interval p of each pair of electrode fingers, is equal to or higher than 0.5 and is lower than 1.0 for each electrode finger.

3. An elastic wave device, comprising
   a substrate of a piezo-electric element containing lithium niobate as a main component; and
   an electrode arranged on the substrate, the electrode being formed in a comb-like shape, and the electrode being made of conductive material having a prescribed thickness, wherein
      a surface of the substrate is set to a plane which is obtained by rotating a plane perpendicular to a crystal Y-axis of the lithium niobate by an angle ranging from 62 degrees to 67 degrees around a crystal x-axis of the lithium niobate, and
      a duty ratio (w/p), which is determined according to both a width w of each of a plurality of electrode fingers composing the electrode and an arrangement interval p of each pair of electrode fingers, is equal to or higher than 0.6 and is lower than 1.0 for each electrode finger.

4. An elastic wave device, comprising
   a substrate of a piezo-electric element containing lithium niobate as a main component; and
   an electrode arranged on the substrate, the electrode being formed in a comb-like shape, and the electrode being made of conductive material having a prescribed thickness, wherein
      a surface of the substrate is set to a plane which is obtained by rotating a plane perpendicular to a crystal Y-axis of the lithium niobate by an angle ranging from 67 degrees to 71 degrees around a crystal x-axis of the lithium niobate, and
      a duty ratio (w/p), which is determined according to both a width w of each of a plurality of electrode fingers composing the electrode and an arrangement interval p of each pair of electrode fingers, is equal to or higher than 0.7 and is lower than 1.0 for each electrode finger.

5. An elastic wave device, comprising
   a substrate of a piezo-electric element containing lithium niobate as a main component; and
   an electrode arranged on the substrate, the electrode being formed in a comb-like shape, and the electrode being made of conductive material having a prescribed thickness, wherein
      a surface of the substrate is set to a plane which is obtained by rotating a plane perpendicular to a crystal Y-axis of the lithium niobate by an angle ranging from 71 degrees to 76 degrees around a crystal x-axis of the lithium niobate, and
      a duty ratio (w/p), which is determined according to both a width w of each of a plurality of electrode fingers composing the electrode and an arrangement interval p of each pair of electrode fingers, is equal to or higher than 0.8 and is lower than 1.0 for each electrode finger.

* * * * *